United States Patent
Lee et al.

(10) Patent No.: US 8,385,456 B2
(45) Date of Patent: Feb. 26, 2013

(54) WIRELESS RADIO FREQUENCY SIGNAL TRANSCEIVING SYSTEM

(75) Inventors: Jr-I Lee, Taipei (TW); Yen-Lin Huang, Taipei (TW); Yen-Tso Chen, Taipei (TW); Chia-Jung Chang, Taipei (TW)

(73) Assignee: National Taiwan University, Taipei (TW)

(*) Notice: Subject to any disclaimer, the term of this patent is extended or adjusted under 35 U.S.C. 154(b) by 818 days.

(21) Appl. No.: 12/572,163

(22) Filed: Oct. 1, 2009

(65) Prior Publication Data

US 2010/0202499 A1    Aug. 12, 2010

(30) Foreign Application Priority Data

Feb. 6, 2009    (TW) .............................. 98103811 A

(51) Int. Cl.
*H04L 27/04* (2006.01)
*H04L 27/06* (2006.01)
*H04L 25/06* (2006.01)

(52) U.S. Cl. ........ 375/268; 375/300; 375/309; 375/318; 375/319; 375/320

(58) Field of Classification Search .................. 375/219, 375/259, 268, 295, 300, 309, 311, 312, 316, 375/317, 318, 319, 320, 340; 329/311, 347, 329/358; 332/106, 115, 149
See application file for complete search history.

(56) References Cited

U.S. PATENT DOCUMENTS

| | | | | |
|---|---|---|---|---|
| 6,292,067 B1* | 9/2001 | Sasabata et al. | .............. | 332/115 |
| 6,408,036 B1* | 6/2002 | Wilson | .......................... | 375/340 |
| 6,842,519 B1* | 1/2005 | Rumbaugh et al. | ........... | 375/312 |
| 7,283,013 B2* | 10/2007 | Arisawa | ........................ | 332/115 |
| 2007/0263749 A1* | 11/2007 | Teng et al. | ..................... | 375/312 |

* cited by examiner

*Primary Examiner* — Betsy Deppe

(57) ABSTRACT

A differential radio frequency signal transmitter is provided. The differential radio frequency signal transmitter includes an oscillator, a modulator and an amplifier module. The oscillator generates a pair of differential oscillation signals. The modulator generates a pair of differential modulated signals according to an input signal and the pair of differential oscillation signals. The input signal is a digital signal. When the input signal is at a first state, the modulator outputs the pair of differential oscillation signals as the pair of differential modulated signals, and when the input signal is at a second state, the modulator outputs a constant voltage signal as the pair of differential modulated signals. The amplifier module receives and amplifies the pair of differential modulated signals and generates a pair of differential radio frequency signals, accordingly.

23 Claims, 9 Drawing Sheets

WIRELESS RADIO FREQUENCY SIGNAL TRANSCEIVING SYSTEM

CROSS REFERENCE TO RELATED APPLICATIONS

This Application claims priority of Taiwan Application No. 98103811, filed on Feb. 6, 2009, the entirety of which is incorporated by reference herein.

BACKGROUND OF THE INVENTION

1. Field of the Invention

The invention relates to a wireless transceiving system, and more particularly to a high speed wireless transceiving system.

2. Description of the Related Art

Along with advancements in technology, electronic consumer products, such as the digital cameras, digital video recorders, mobile phones, personal digital assistants (PDA), Universal Serial Bus (USB) storage disks, and personal computers, among others, have been rapidly developed. Electronic consumer products usually include a memory to store data required by the system operations or the data set or recorded by the user. However, for conventional designs, a wired transmission line, such as a USB transmission line, a High Definition Multimedia Interface (HDMI) transmission line, or the likes, is needed for transmitting data between the electronic consumer products. Data transmission therebetween, is therefore limited by the hardware devices used and restricted transmission bandwidths.

Thus, a high speed wireless transceiving system with wide transmission bandwidths and high data transmission rates is highly required.

BRIEF SUMMARY OF THE INVENTION

Differential radio frequency signal transmitters, differential radio frequency signal receivers and a wireless radio frequency signal transceiving systems are provided. An exemplary embodiment of a differential radio frequency signal transmitter includes an oscillator, a modulator and an amplifier module. The oscillator generates a pair of differential oscillation signals. The modulator generates a pair of differential modulated signals according to an input signal and the pair of differential oscillation signals. The input signal is a digital signal. When the input signal is at a first state, the modulator outputs the pair of differential oscillation signals as the pair of differential modulated signals, and when the input signal is at a second state, the modulator outputs a constant voltage signal as the pair of differential modulated signals. The amplifier module receives and amplifies the pair of differential modulated signals and generates a pair of differential radio frequency signals, accordingly.

An exemplary embodiment of a differential radio frequency signal receiver comprises a demodulator receiving a pair of differential input signals and generating a pair of differential output signals. The pair of differential input signals is a pair of differential alternating current (AC) signals during a first time interval, and is a pair of direct current (DC) signals during a second time interval. The demodulator comprises an AC coupling circuit, a bias circuit, a rectifier circuit, a single to differential conversion circuit and an offset compensation circuit. The AC coupling circuit receives the pair of differential input signals, couples AC signal portions of the pair of differential input signals, and generates a pair of differential coupled signals. The bias circuit provides an operation bias voltage. The rectifier circuit is coupled to the AC coupling circuit and the bias circuit and generates a rectified signal according to the pair of differential coupled signals and the operation bias voltage. During the first time interval, the rectifier circuit generates the rectified signal with a first DC bias voltage according to the pair of differential coupled signals, and during the second time interval, the rectifier circuit generates the rectified signal with a second DC bias voltage according to the operation bias voltage. The single to differential conversion circuit differentially amplifies the rectified signal and generates a pair of differential converted signals. The offset compensation circuit adjusts a DC voltage of the pair of differential converted signals to generate the pair of differential output signals with DC matching.

An exemplary embodiment of a wireless radio frequency signal transceiving system comprises a differential radio frequency signal transmitter and a differential radio frequency signal receiver. The differential radio frequency signal transmitter generates a pair of differential modulated signal according to an input signal and a pair of differential oscillation signals, amplifies the pair of differential modulated signals to generate a pair of differential radio frequency signals, and transmits the pair of differential radio frequency signals. The input signal is a digital signal. When the input signal is at a first state, the modulator outputs the pair of differential oscillation signals as the pair of differential modulated signals, and when the input signal is at a second state, the modulator outputs a constant voltage signal as the pair of differential modulated signals. The differential radio frequency signal receiver receives the pair of differential radio frequency signals from a radio interface, and demodulates the pair of differential radio frequency signals to generate a pair of differential output signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

According to an embodiment of the invention, a high speed wireless radio frequency signal transceiving system with 60 GHz carrier frequency is provided. The frequency band around 60 GHz is a license free region for commercial or populace use. Compared with the conventional 2.4 GHz frequency band, the 60 GHz may be used with a wider bandwidth (achieving a bandwidth width of 7 GHz). Thus, data transmissions with much higher speeds (i.e. data rate) may be realized. However, it is difficult to design a transceiving system to operate at an extremely high frequency such as 60 GHz. Thus, according to an embodiment of the invention, a novel modulation scheme is provided and implemented by using a simple circuit structure (as shown in FIG. 1), successfully realizing a high speed wireless radio frequency signal transceiving system with 60 GHz carrier frequency.

Figure 1:
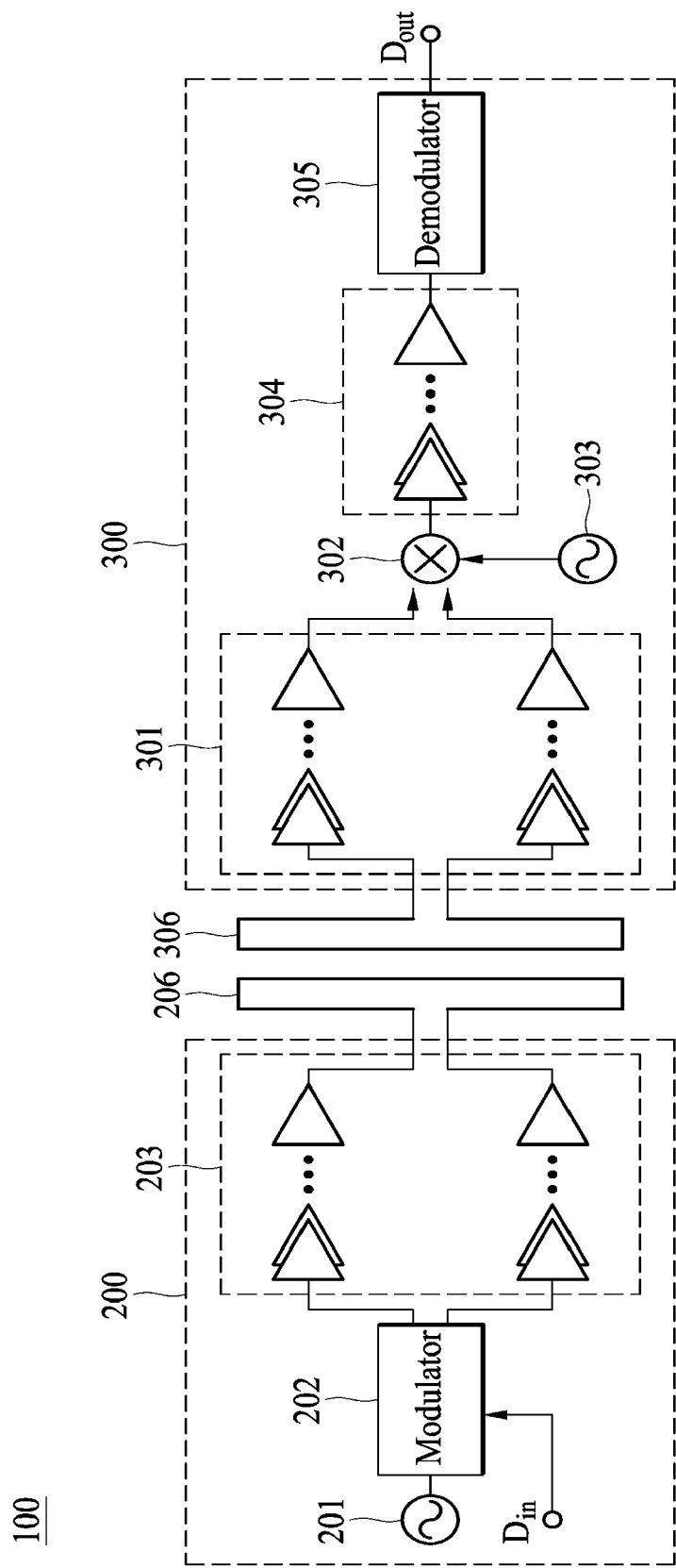
FIG. 1 illustrates a schematic diagram of a wireless radio frequency transceiving system according to an embodiment of the invention.

FIG. 1 illustrates a schematic diagram of a wireless radio frequency transceiving system 100 according to an embodiment of the invention. The wireless radio frequency transceiving system 100 comprises a transmitter 200, a receiver 300, and folded dipole antennas 206 and 306 each coupled to the transmitter 200 and the receiver 300. The transmitter 200 modulates an input signal $D_{in}$ and generates a pair of differential radio frequency signals, accordingly. The pair of differential radio frequency signals is then transmitted to the radio interface via the antenna 206. The receiver 300 receives the pair of differential radio frequency signals from the radio interface via the antenna 306, and demodulates the pair of differential radio frequency signals so as to recover the originally transmitted signals and generate a pair of differential output signals $D_{out}$.

As shown in FIG. 1, the transmitter 200 comprises an oscillator 201, a modulator 202 and an amplifier module 203. The oscillator 201 generates a pair of differential oscillation signals that are oscillated at an oscillation frequency. The oscillation frequency equals to a carrier frequency of the pair of differential radio frequency signals. According to an embodiment of the invention, the oscillator 201 is a high frequency oscillator. The oscillator 201 generates a pair of differential oscillation signals that are oscillated at 60 GHz for the wireless radio frequency transceiving system 100 that is assumed to be operated at 60 GHz. The modulator 202 generates a pair of differential modulated signals according to the input signal $D_{in}$ and the pair of differential oscillation signals generated by the oscillator 201. According to an embodiment of the invention, the input signal $D_{in}$ is a digital signal, and when the input signal $D_{in}$ is at a first state (as an example, the logic 1), the modulator 202 outputs the pair of differential oscillation signals as the pair of differential modulated signals, and when the input signal $D_{in}$ is at a second state (as an example, the logic 0), the modulator 202 outputs a constant voltage signal as the pair of differential modulated signals. The amplifier module 203 may comprise a plurality of amplifier circuits to receive and amplify power of the pair of differential modulated signals, and generate a pair of differential radio frequency signals to be transmitted by the transmitter 200, accordingly.

Figure 2:
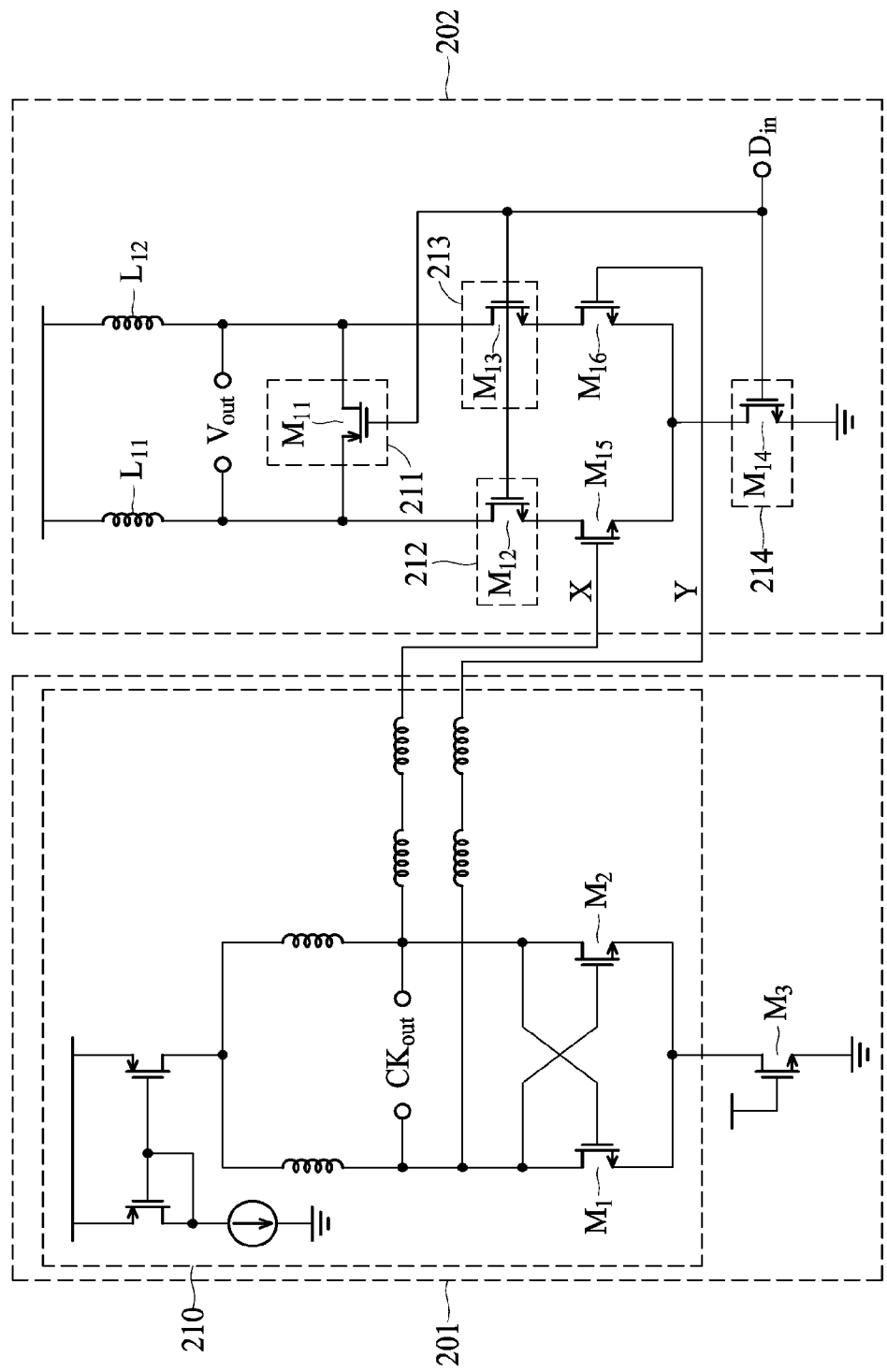
FIG. 2 illustrates the circuit diagram of the oscillator and the modulator according to an embodiment of the invention.

FIG. 2 illustrates the circuit diagram of the oscillator and the modulator according to an embodiment of the invention. As shown in FIG. 2, the oscillator 201 comprises an oscillation circuit 210 generating the pair of differential oscillation signals $CK_{out}$ at a pair of differential output terminals. The modulator 202 comprises a modulation circuit comprising two inductors $L_{11}$ and $L_{12}$ and the switches 211, 212, 213 and 214 and a transconductance circuit comprising transistors $M_{15}$ and $M_{16}$. According to an embodiment of the invention, the transistors $M_{15}$ and $M_{16}$ may be transconductance transistors, and the transconductance circuit receives the pair of differential oscillation signals $CK_{out}$ at terminals X and Y. The modulation circuit is coupled to the transconductance circuit and generates the pair of differential modulated signals $V_{out}$ according to the input signal $D_{in}$.

When the input signal $D_{in}$ is at the first state, the switches 212, 213 and 214 are turned on to pass the high frequency differential oscillation signals to the output terminals of the modulator 202 via the transconductance transistors $M_{15}$ and $M_{16}$, respectively. Thus, the pair of differential oscillation signals $CK_{out}$ is outputted as the pair of differential modulated signals $V_{out}$. On the other hand, when the input signal $D_{in}$ is at the second state, the switches 212, 213 and 214 are turned off so that the pair of high frequency differential oscillation signals is not able to be outputted to the output terminals of the modulator 202, thus leaving the pair of differential modulated signals $V_{out}$ in a constant voltage signal. It is noted that according to the embodiment of the invention, when the input signal $D_{in}$ is at the second state, the switch 211 is turned on to speed up the time for stabilizing the voltages of the pair of differential modulated signals $V_{out}$.

Figure 3:
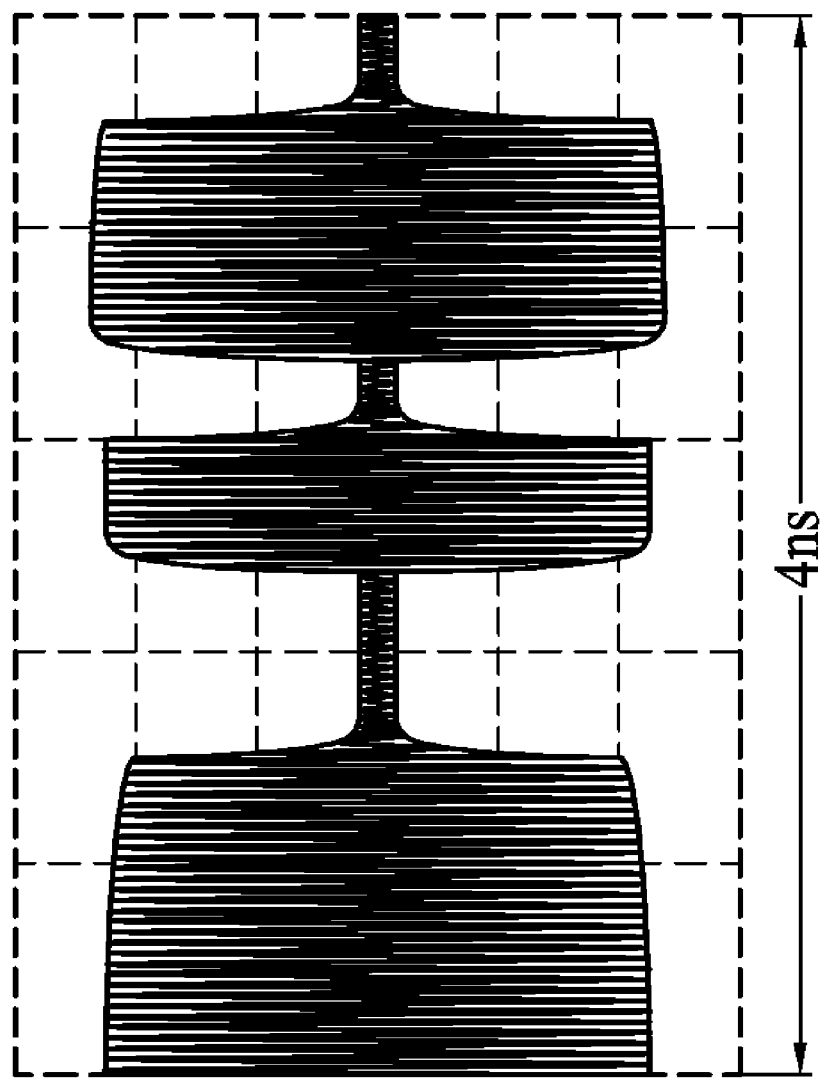
FIG. 3 illustrates an exemplary waveform of a modulated signal according to an embodiment of the invention.

FIG. 3 illustrates an exemplary waveform of a modulated signal according to an embodiment of the invention. As can be seen, when the input signal $D_{in}$ is at the first state, the modulated signal is a high frequency alternating current (AC) signal. When the input signal $D_{in}$ is at the second state, the modulated signal is a direct current (DC) signal with a constant voltage. The turned on switch 211 is used to quickly pull down the signal level of the high frequency AC signal to the constant voltage DC signal. In this way, the modulated signals are able to quickly be converted from an AC signal to a DC signal, and the performance of the modulator 202 is thus, highly improved. The improvement makes the modulator 202 able to be operated at a frequency higher than that of the conventional modulators. Further, it should be noted that for conventional transmitter designs, both of a modulation circuit and a up conversion circuit are always needed for modulating the signal and up converting (for example, via a mixer) the modulated signal to the radio frequency signal, wherein the carrier frequency is required in the transmission system before being transmitted via the output antenna. However, according to the embodiment of the invention and as shown in FIG. 2 and FIG. 3, the modulation and up conversion are integrally performed by the modulator 202. Thus, the transmitter circuit is greatly simplified while still achieving high speed modulation capability.

According to an embodiment of the invention, the switches 211, 212, 213 and 214 may be transistors, such as the transistors $M_{11}$, $M_{12}$, $M_{13}$ and $M_{14}$. Each of the transistors $M_{11}$, $M_{12}$, $M_{13}$ and $M_{14}$ comprise a gate receiving the input signal $D_{in}$ and the transistors are turned on or off according to the signal level of the input signal $D_{in}$. The transistor $M_{11}$ and the transistors $M_{12}$, $M_{13}$ and $M_{14}$ may different types. As an example, transistor $M_{11}$ may be the P type transistor while the transistors $M_{12}$, $M_{13}$ and $M_{14}$ may be the N type transistor. It is noted that the switches 211, 212, 213 and 214 should not be limited to the transistors. According to other embodiments of the invention, the switches 211, 212, 213 and 214 may also be implemented by any other elements performing substantially the same function or achieving substantially the same result. Thus, the scope of the present invention shall be defined and protected by the following claims and their equivalents, and should not be limited to the illustrated circuit.

In addition, it is noted that for the oscillation circuit 210, a transistor $M_3$ is added between the transistors $M_1$ and $M_2$ and a ground so as to provide a DC bias voltage for the differential oscillation signal $CK_{out}$. The circuit structures of the oscillator 201 and the modulator 202 are thus balanced (for example, the circuit structure of the transistors $M_1$, $M_2$ and $M_3$ corresponds to the circuit structure of the transistors $M_{15}$, $M_{16}$ and $M_{14}$). Further, the transistor $M_3$ is also used to analogize to the conducting resistance of the switch 214 of the modulation circuit. For example, the transistors $M_3$ may have the same resistance as the $M_{14}$ when turned on. Thus, the modulation circuit and the oscillator may be perfectly DC coupled and an optimum input bias may be obtained without using any additional transconductance circuits (such as the transistors $M_{15}$ and $M_{16}$) to provide the DC bias. As illustrated, a novel circuit design with a novel on-off keying (OOK) modulation (also called an amplitude shift keying (ASK) modulation) scheme is achieved to realize an extremely high speed modulator.

Referring back to FIG. 1, according to an embodiment of the invention, the amplifier module 205 may comprise two amplifying paths (as shown by the upper and lower paths) to provide a pseudo differential amplifier. Each of the differential modulated signals may be amplified in one amplifying path, and the differential output signals may be directly passed to the differential input terminals of the folded dipole antenna 206. According to the embodiment of the invention, each amplifying path may comprise a plurality of amplifiers coupled in serial. For example, according to a preferred embodiment of the invention, five stages of amplifiers may be coupled in serial to amplify the power of the output signal. An input matching circuit coupled to an output terminal of a previous stage may be comprised in the first stage of amplifiers so as to match the output impedance of the previous stage with an input impedance of the amplifier. An inter-stage matching circuit may also be comprised between two stages of the amplifiers so as to match the impedance between the amplifiers. According to the embodiment of the invention, the matching circuit may be designed to conjugate match the input impedance with the output impedance. The transmission power in each stage may thus be maximized so as to further increase the output signal power of the amplifier.

Figure 4:
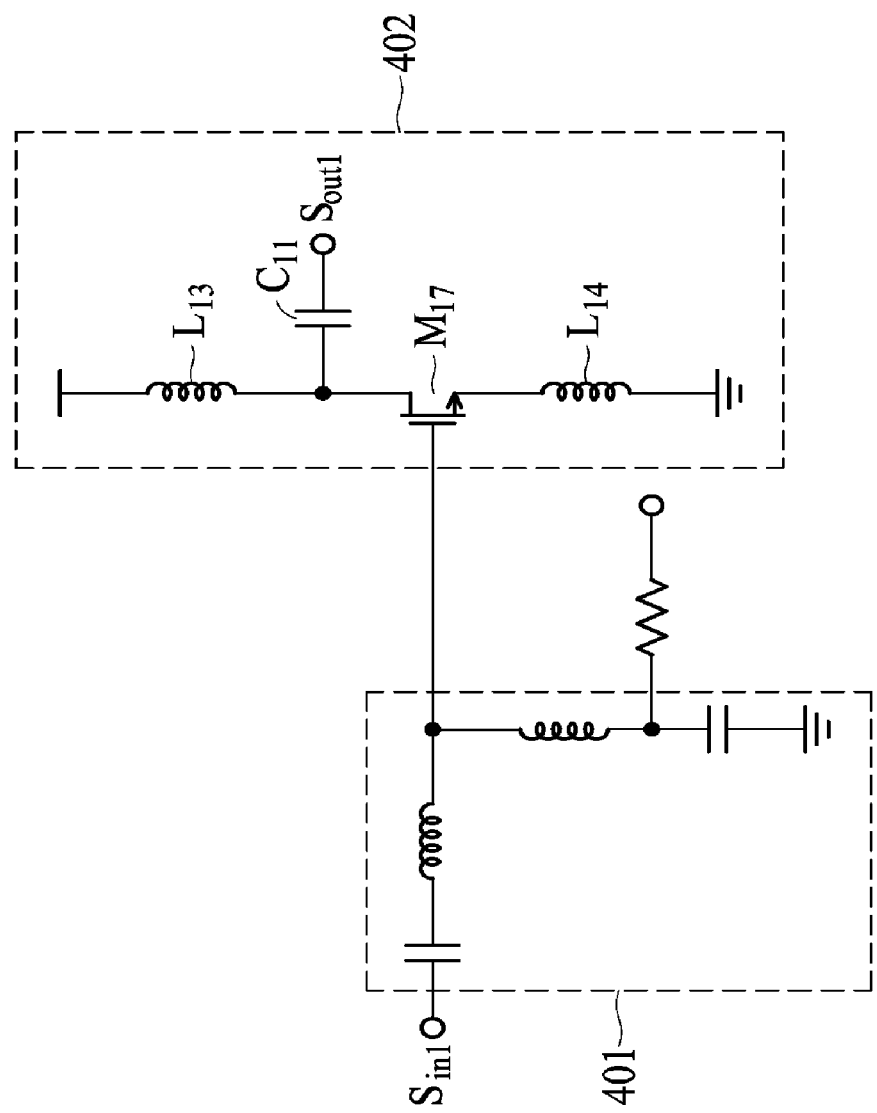
FIG. 4 illustrates an amplifier circuit according to an embodiment of the invention.

FIG. 4 illustrates an amplifier circuit according to an embodiment of the invention. As shown in FIG. 4, the amplifier comprises a matching circuit 401 and an amplifier circuit 402. As previously described, the matching circuit 401 contributes an input impedance that matches with the output impedance of the previous stage at the input terminal $S_{in1}$. The amplifier circuit 402 comprises an inductor $L_{13}$ coupled to a voltage source, a capacitor $C_{11}$ coupled between the inductor $L_{13}$ and an output terminal $S_{out1}$ of the amplifier circuit 402, and a transistor $M_{17}$. The transistor $M_{17}$ comprises a gate coupled to the matching circuit 401 and a drain coupled to the inductor $L_{13}$ and the capacitor $C_{11}$. It is noted that according to an embodiment of the invention, an inductive source degeneration technique is adopted in the amplifier circuit 402 by coupling an inductor $L_{14}$ to a source of the transistor $M_{17}$, so as to adequately suppress the gain of the amplifier and increase the linearity of the amplifier. In this way, the amplifier is capable of receiving the signal with greater energy and still linearly generates the output signal.

Referring back to FIG. 1, the receiver structure according to the embodiment of the invention will be illustrated in detail in the following paragraphs. As shown in FIG. 1, the receiver 300 comprises a low noise amplifier module 301, a mixer 302, an oscillator 303, a medium frequency amplifier 304 and a demodulator 305. The low noise amplifier module 301 receives a pair of differential radio frequency signals from the antenna 306 and amplifies the pair of differential radio frequency signals to generate a pair of differential amplified signals, accordingly. The oscillator 303 generates a reference oscillation signal oscillated at a reference frequency. According to an embodiment of the invention, when the carrier of the transmission system is, for example, 60 GHz, the oscillator 303 generates a reference oscillation signal oscillated at 50 GHz. The mixer 302 receives the pair of differential amplified signals and down converts the pair of differential amplified signals according to the reference oscillation signal to generate the pair of differential medium frequency signals. The medium frequency amplifier 304 receives and amplifies the pair of differential medium frequency signals, and passes the amplified medium frequency signals to the demodulator 305. The demodulator 305 receives a pair of differential input signals, demodulates the pair of differential input signals to recover the originally transmitted data, and generates the pair of differential output signals $D_{out}$.

According to an embodiment of the invention, the low noise amplifier module 301 may also comprise two amplifying paths (as the upper and lower paths shown in FIG. 1) to provide a pseudo differential amplifier for the use of a folded dipole antenna, and may amplify either one of the received differential radio frequency signals in one amplifying path. According to an embodiment of the invention, each amplifying path may also comprise a plurality of low noise amplifiers coupled in serial. For example, according to a preferred embodiment of the invention, five stages of amplifier may be coupled in serial to amplify the power of the output signal. An input matching circuit coupled to an output terminal of a previous stage may be comprised in the first stage of amplifiers so as to match the output impedance of the previous stage to an input impedance of the amplifier. An inter-stage matching circuit may also be comprised between two stages of the amplifiers so as to match the impedance between the amplifiers. According to the embodiment of the invention, the matching circuit may be designed to conjugate match the input impedance to the output impedance. The transmission power in each stage may thus be maximized so as to further increase the output signal power of the amplifier.

Figure 5:
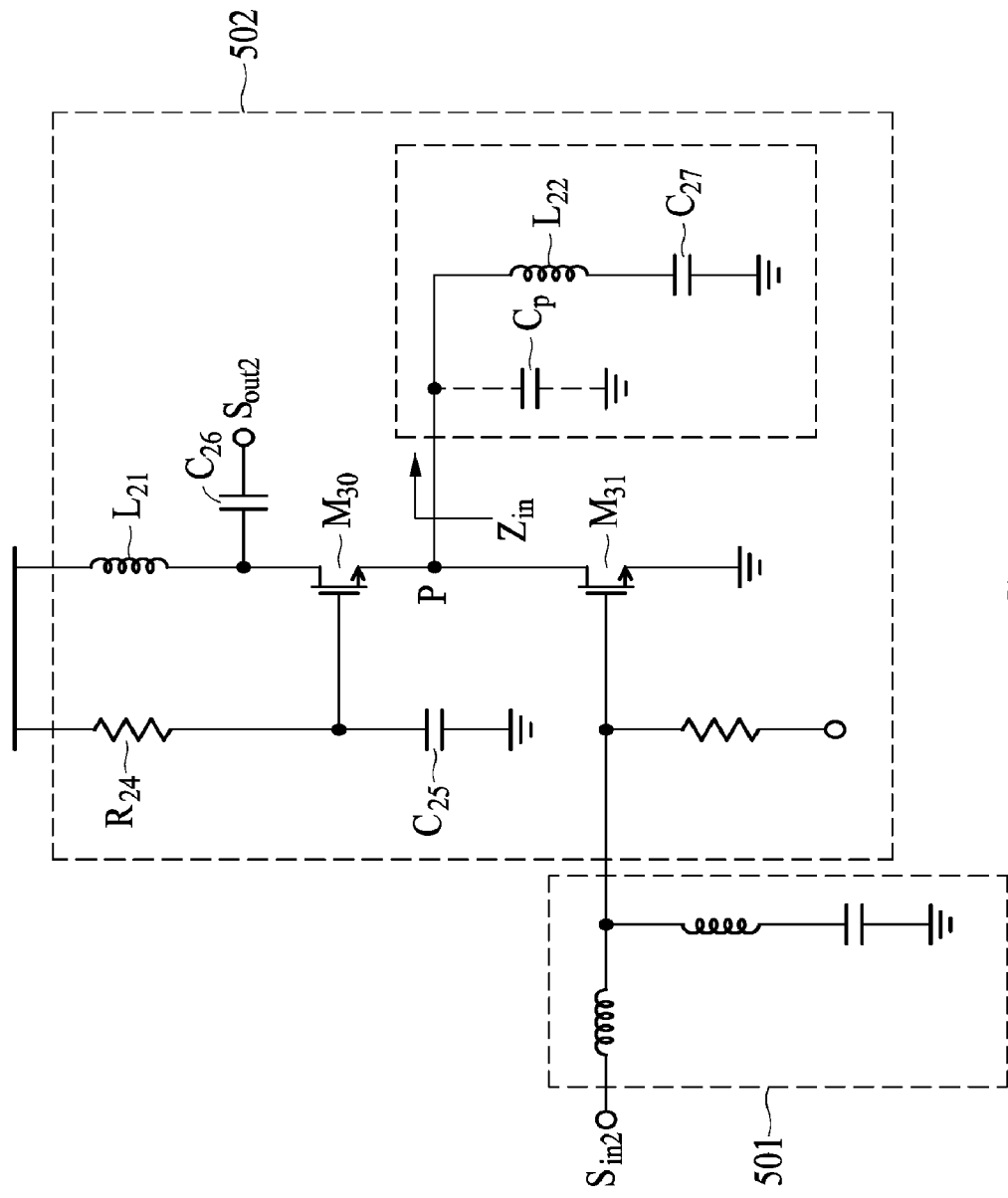
FIG. 5 illustrates a low noise amplifier circuit according to an embodiment of the invention.

FIG. 5 illustrates a low noise amplifier circuit according to an embodiment of the invention. The low noise amplifier comprises a matching circuit 501 and an amplifier circuit 502. The matching circuit 501 is coupled to an output terminal of the previous stage to provide the input impedance matched with the output impedance of the previous stage. The amplifier circuit 502 comprises a resistor $R_{24}$ coupled to the voltage source, a $C_{25}$ capacitor coupled between the resistor $R_{24}$ and a ground, an inductor $L_{21}$ coupled to the voltage source, a capacitor $C_{26}$ coupled to between the inductor $L_{21}$ and the output terminal $S_{out2}$, a transistor $M_{30}$ coupled to the capacitors $C_{25}$ and $C_{26}$, and a transistor $M_{31}$ coupled between the transistor $M_{30}$, the matching circuit 501 and the ground. It is noted that according to an embodiment of the invention, in each stage of amplifiers, the shunt peaking technique is adopted so as to resonate out the parasitic capacitor $C_p$ at a connection node P of the transistors $M_{30}$ and $M_{31}$ by coupling an inductor $L_{22}$ and a large capacitor $C_{27}$ in serial. The impedance $Z_{in}$ of a resonant circuit is high for the high frequency signals and thus, the high frequency current signal, which is converted from the high frequency voltage signal by the transistor $M_{30}$, does not flow away from the terminal P via the parasitic capacitor $C_p$. In addition, by adequately adjusting the capacitance of the large capacitor $C_{27}$, the low frequency signals may short to ground at the terminal P (i.e., for the low frequency signals, $Z_{in}=0$) so as to filter out the low frequency signals. According to an embodiment of the invention, by adjusting the capacitance of the large capacitor $C_{27}$ and the inductance of the inductor $L_{22}$, the possible images, that are generated when down converting the differential radio frequency signals to the differential medium frequency signals, may be filtered out (i.e. rejected) in advance. As an example, in the 60 GHz transmission system, by designing the capacitance of the large capacitor $C_{27}$ and the inductance of the inductor $L_{22}$, the images at 40 GHz may be filtered out and would not become the possible interference after the down conversion of the mixer 302.

Figure 6:
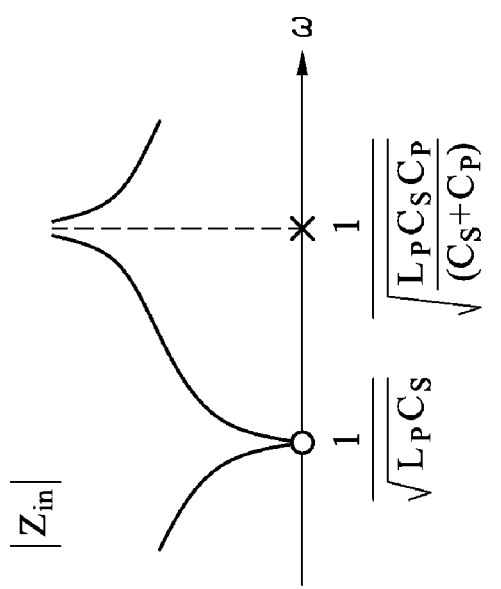
FIG. 6 shows a characteristic curve of the impedance $Z_{in}$ viewed from the terminal P.

FIG. 6 shows a characteristic curve of the impedance $Z_{in}$ viewed from the terminal P, where $L_p$ represents the inductance of the inductor $L_{22}$, $C_s$ represents the capacitance of the capacitor $C_{27}$, and $C_p$ represents the capacitance of the parasitic capacitor $C_p$. As can be seen, when the frequency $\omega$ is $$\frac{1}{\sqrt{\frac{L_P C_S C_P}{(C_S + C_P)}}},$$

$Z_{in}$ is a high impedance. Thus, the high frequency signal would not flow away from the terminal P via the parasitic capacitor $C_p$. When the frequency $\omega$ is $$\frac{1}{\sqrt{L_P C_S}},$$

$Z_{in}$ equals to zero so as to filter out the images. As can be seen, the use of the shunt peaking technique not only increases the gain of the low noise amplifier, but also filters out the low frequency noise.

Figure 7:
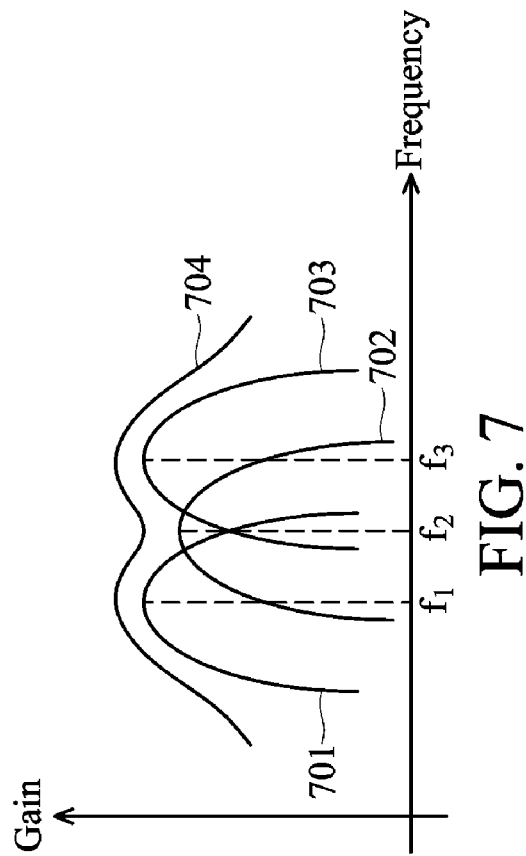
FIG. 7 illustrates the frequency responses obtained by coupling three stages of low noise amplifiers in serial.

FIG. 7 illustrates the frequency responses obtained by coupling three stages of low noise amplifiers in serial. As shown in FIG. 7, the curve 701 represents the frequency response of the low noise amplifier in the first stage, the curve 702 represents the frequency response of the low noise amplifier in the second stage, the curve 703 represents the frequency response of the low noise amplifier in the third stage, and the curve 704 represents the overall frequency response of the three stages low noise amplifiers. As can be seen from the figure, by adjusting the frequency response in each stage, the maximum gain may be obtained at different frequencies, and the overall bandwidth may be effectively increased.

Figure 8:
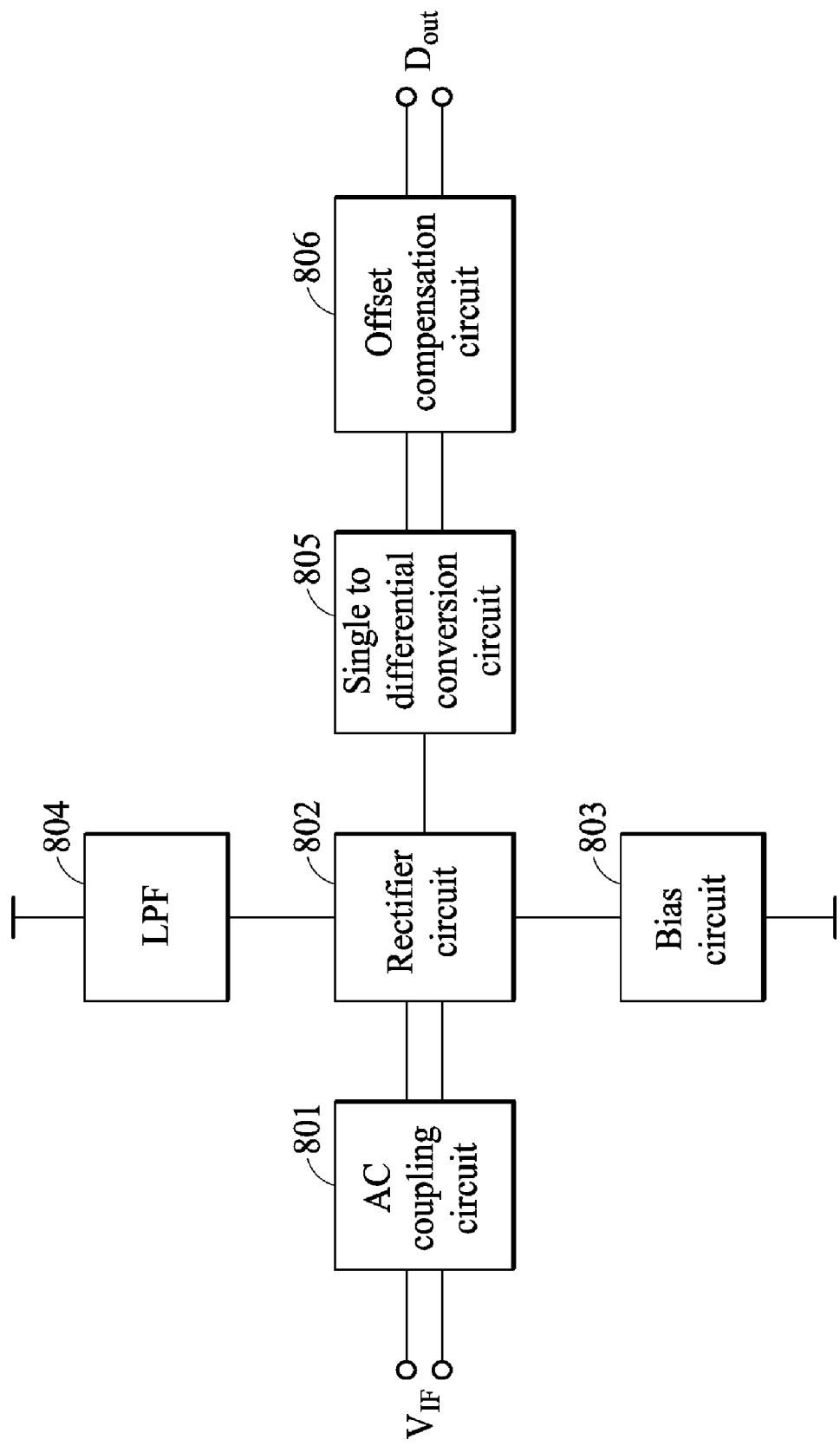
FIG. 8 illustrates a block diagram of a demodulator according to an embodiment of the invention.

FIG. 8 illustrates a block diagram of a demodulator according to an embodiment of the invention. The demodulator comprises an AC coupling circuit 801, a rectifier circuit 802, a bias circuit 803, a low pass filter (LPF) 804, a single to differential conversion circuit 805 and an offset compensation circuit 806. The demodulator receives the pair of differential input signals $V_{IF}$ from the differential input terminals. The differential input signals represent two states (for example, the logic 1 and 0) of a digital signal by alternating the AC and DC signal as shown in FIG. 3. For example, the pair of differential input signals is a pair of differential AC signals during a first time interval, and is a pair of DC signals during a second time interval. The AC coupling circuit 801 receives the pair of differential input signals from the differential input terminals, couples AC signal portions of the pair of differential input signals, and generates a pair of differential coupled signals. The bias circuit 803 provides an operation bias voltage to the rectifier circuit 802. The rectifier circuit 802 is coupled to the AC coupling circuit 801 and the bias circuit 803 and generates a rectified signal according to the pair of differential coupled signals and the operation bias voltage. When the pair of differential input signals is a pair of differential AC signals, for example, during the first time interval, the rectifier circuit 802 generates the rectified signal with a first DC bias voltage according to the pair of differential coupled signals. On the other hand, when the pair of differential input signals is a pair of DC signals, for example, during the second time interval, the rectifier circuit 802 generates the rectified signal with a constant voltage according to the operation bias voltage provided by the bias circuit 803, wherein the constant voltage is a second DC bias voltage different from the first DC bias voltage so as to differentiate two states of the original signal. The LPF 804 is coupled to the rectifier circuit 802 to filter out the high frequency portion of the rectified signal. The single to differential conversion circuit 805 differentially amplifies the rectified signal so as to convert the single end rectified signal to a pair of differential converted signals. The offset compensation circuit 806 adjusting the DC of the pair of differential converted signals to generate the pair of differential output signals $D_{out}$ with DC matching.

Figure 9:
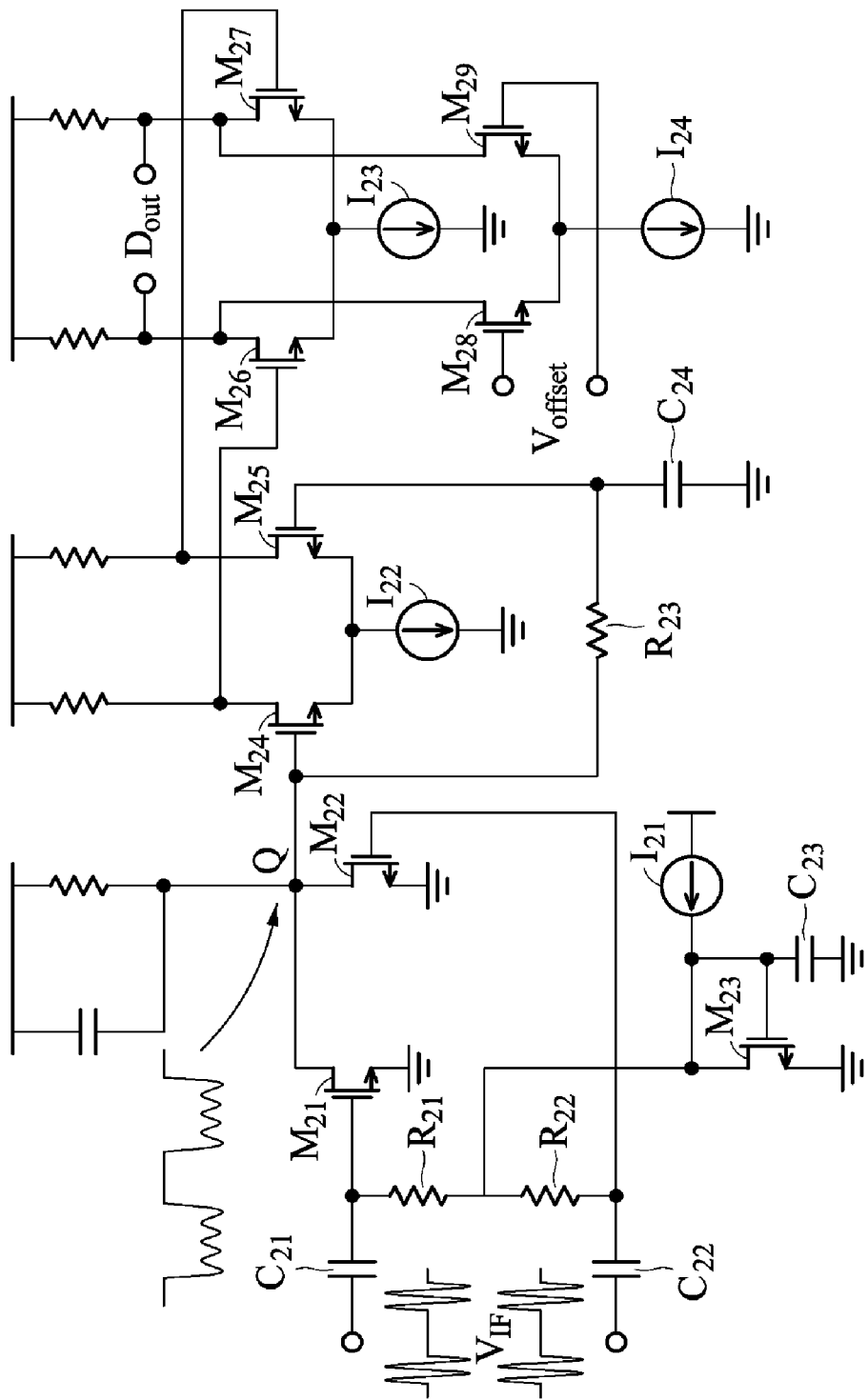
FIG. 9 illustrates a demodulator circuit according to an embodiment of the invention.

FIG. 9 illustrates a demodulator circuit according to an embodiment of the invention. As shown in FIG. 9, the AC coupling circuit comprises two capacitors $C_{21}$ and $C_{22}$ to receive the pair of medium frequency differential input signals $V_{IF}$, respectively, and output the pair of differential coupled signals. The rectifier circuit 802 comprises transistors $M_{21}$ and $M_{22}$ to receive one of the differential coupled signals, respectively. The transistors $M_{21}$ and $M_{22}$ are coupled to a rectifier output terminal Q outputting the rectified signal. The bias circuit 803 comprises the resistors $R_{21}$ and $R_{22}$ coupled between the capacitors $C_{21}$ and $C_{22}$, a current source $I_{21}$ coupled to a connection node of the resistors $R_{21}$ and $R_{22}$, a capacitor $C_{23}$ coupled between the current source $I_{21}$ and the ground, and a transistor $M_{23}$ coupled between the connection node of the resistors $R_{21}$ and $R_{22}$, the capacitor $C_{23}$, the current source $I_{21}$ and the ground. According to an embodiment of the invention, when the pair of differential input signals $V_{IF}$ is a pair of differential AC signals, for example, during the first time interval as previously described, the transistors $M_{21}$ and $M_{22}$ generate the corresponding rectified signal according to the differential input signals $V_{IF}$ at the rectifier output terminal Q. On the other hand, when the pair of differential input signals $V_{IF}$ is a pair of DC signals, for example, during the second time interval as previously described, the transistors $M_{21}$ and $M_{22}$ are turned on according to the bias voltage provided by the bias circuit 803 so as to generate the DC signals with the second DC bias voltage as the rectified signal at the rectifier output terminal Q. For example, as shown in FIG. 9, when the pair of differential input signals $V_{IF}$ is a pair of DC signals, the rectified signal at the rectifier output terminal Q has high voltage level, and when pair of differential input signals $V_{IF}$ is a pair of high frequency AC signals, the rectified signal at the rectifier output terminal Q has low voltage level. In this way, the OOK modulated signals are demodulated to the digital signals.

The LPF 804 comprises a resistor and a capacitor coupled to the rectifier circuit at the rectifier output terminal Q to filter out the high frequency leakage current. According to an embodiment of the invention, the high frequency leakage current may be the portion of signals with frequency twice as high as the medium frequency. For example, when the differential signals are down converted to the medium frequency signals of 10 GHz, the LPF 804 may be designed to filter out the frequency leakage current at 20 GHz. The single to differential conversion circuit 805 comprises the current source $I_{22}$, the transistors $M_{24}$ and $M_{25}$, the resistor $R_{23}$ and the capacitor $C_{24}$. The transistor $M_{24}$ is coupled between a first differential output terminal of the single to differential conversion circuit 805, the rectifier output terminal Q and the current source $I_{22}$. The transistor $M_{25}$ is coupled to a second differential output terminal of the single to differential conversion circuit 805 and the current source $I_{22}$. For generating the differential output signals, the single to differential conversion circuit 805 extracts the DC portion at the rectifier output terminal Q via the resistor $R_{23}$ and the capacitor $C_{24}$, and differentially amplifier the DC portion and the signal at the rectifier output terminal Q. The pair of differential converted signals is thus generated at one terminal of the transistors $M_{24}$ and $M_{25}$.

In order to further balance the DC value of the differential converted signals, the demodulator comprises the offset compensation circuit 806 to adjust the DC voltage of the differential converted signals and generates the pair of differential output signals $D_{out}$ with DC matching. The offset compensation circuit may be accomplished by two pairs of transistors and two current sources, such as the transistors $M_{26}$ and $M_{27}$ and the current source $I_{23}$, and the transistors $M_{28}$ and $M_{29}$ and the current source $I_{24}$. The transistors $M_{26}$ and $M_{27}$ receive the differential converted signals from the single to differential conversion circuit 805, and the transistors $M_{28}$ and $M_{29}$ receive an offset compensation voltage $V_{offset}$, wherein a value of the offset compensation voltage $V_{offset}$ may be adjusted according to the current ratio of the transistors $M_{26}$ and $M_{27}$. In this way, the transistors $M_{28}$ and $M_{29}$ sharing the current source $I_{24}$ distribute the current according to the offset compensation voltage $V_{offset}$ so as to balance the currents in the two paths along the longitude direction and to obtain the differential output signals $D_{out}$ with identical DC value.

Figure 10:
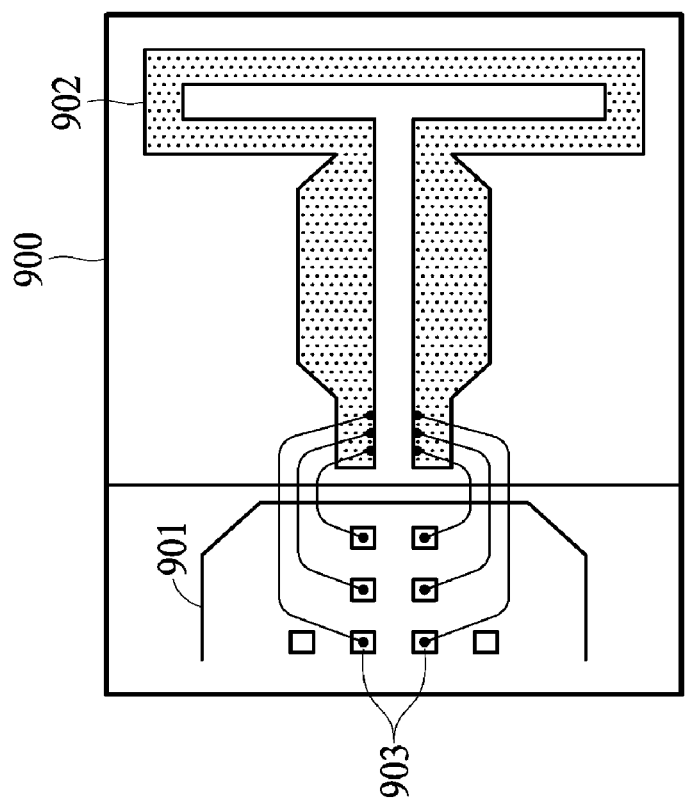
FIG. 10 shows a top view of the board according to an embodiment of the invention.

Referring back to FIG. 1, according to an embodiment of the invention, the oscillator 201, modulator 202 and the amplifier module 203 may be integrated in a transmitter chip, and the high frequency folded dipole antenna 206 may be implemented as the on-board antenna. Similarly, the low noise amplifier module 301, the mixer 302, the oscillator 303, the medium frequency amplifier 304 and the demodulator 305 may also be integrated in a receiver chip, and the high frequency folded dipole antenna 306 may be implemented as the on-board antenna. FIG. 10 shows a top view of the board according to an embodiment of the invention. As shown in FIG. 10, the chip 901 and the antenna 902 are packaged in the board 900. The chip 901 may be the transmitter chip or the receiver chip as previously described and the antenna 902 may be the folded dipole antenna 206 or 306. The chip 901 is coupled to the antenna 902 via the traces. It is noted that according to embodiment of the invention, different from the conventional chip design, multiple pads are disposed on each of the differential input terminals and the differential output terminals so as to reduce the parasitic inductance of the bonding wires. As shown in FIG. 10, each terminal comprises three pads 903. Thus, a total number of six pads are disposed for the differential input terminals (or differential output terminals). The connection between the chip and the antenna is accomplished via the pads 903 and the bounding wires arranged in parallel. The parasitic inductance of the bonding wires is thus greatly reduced due to the parallel structure.

Figure 11:
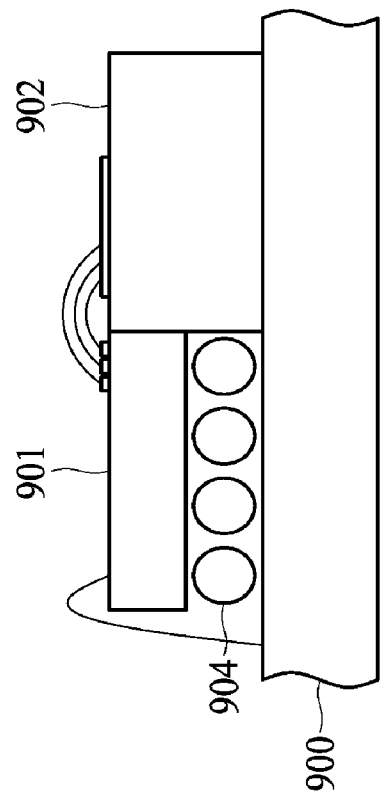
FIG. 11 shows a side view of the board as shown in FIG. 10.

FIG. 11 shows a side view of the board as shown in FIG. 10. According to another embodiment of the invention, the Ball Grid Array (BGA) solder balls 904 are padded under the chip 901 so as to make the height of the chip identical to the height of the antenna. The parasitic inductance of the bonding wires is therefore further reduced.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A differential radio frequency signal transmitter, comprising:
    an oscillator generating a pair of differential oscillation signals;
    a modulator generating a pair of differential modulated signals according to an input signal and the pair of differential oscillation signals, wherein the input signal is a digital signal, and when the input signal is at a first state, the modulator outputs the pair of differential oscillation signals as the pair of differential modulated signals, and when the input signal is at a second state, the modulator outputs a constant voltage signal as the pair of differential modulated signals; and
    an amplifier module receiving and amplifying the pair of differential modulated signals, and generating a pair of differential radio frequency signals, accordingly.

2. The differential radio frequency signal transmitter as claimed in claim 1, wherein the amplifier module transmits the pair of differential radio frequency signals via an output antenna.

3. The differential radio frequency signal transmitter as claimed in claim 1, wherein the modulator comprises:
    a transconductance circuit receiving the pair of differential oscillation signals; and
    a modulation circuit coupled to the transconductance circuit and generating the pair of differential modulated signals according to the input signal, wherein the modulation circuit comprises a first switch coupled between a pair of different output terminals of the modulator, and when the input signal is at the second state, the first switch is turned on.

4. The differential radio frequency signal transmitter as claimed in claim 1, wherein an oscillation frequency of the pair of differential oscillation signals equals a carrier frequency of the pair of differential radio frequency signals, and the modulator modulates the input signal according to the pair of differential oscillation signals to generate the pair of differential modulated signals.

5. The differential radio frequency signal transmitter as claimed in claim 1, wherein the first state and the second state of the input signal are logic 1 and logic 0, or logic 0 and logic 1, respectively.

6. The differential radio frequency signal transmitter as claimed in claim 1, wherein the first state and the second state represents a high voltage level and a low voltage level, or a low voltage level and a high voltage level, respectively.

7. The differential radio frequency signal transmitter as claimed in claim 1, wherein the amplifier module comprises two amplifying paths.

8. The differential radio frequency signal transmitter as claimed in claim 7, wherein each amplifying path comprises a plurality of amplifying circuits coupled in serial.

9. The differential radio frequency signal transmitter as claimed in claim 1, wherein the oscillator, the modulator and the amplifier module are integrated in a chip, and the chip comprises a first output terminal and a second output terminal outputting the pair of differential radio frequency signals.

10. The differential radio frequency signal transmitter as claimed in claim 9, wherein each of the first output terminal and the second output terminal comprises a plurality of pads, and the pair of differential radio frequency signals is transmitted via the plurality of pads.

11. The differential radio frequency signal transmitter as claimed in claim 9, wherein the chip is packaged by using a Ball Grid Array (BGA) packaging process.

12. A differential radio frequency signal receiver, comprising:
   a demodulator receiving a pair of differential input signals and generating a pair of differential output signals, wherein the pair of differential input signals is a pair of differential alternating current (AC) signals during a first time interval, and is a pair of direct current (DC) signals during a second time interval, and the demodulator comprises:
      an AC coupling circuit receiving the pair of differential input signals, coupling AC signal portions of the pair of differential input signals, and generating a pair of differential coupled signals;
      a bias circuit providing an operation bias voltage;
      a rectifier circuit coupled to the AC coupling circuit and the bias circuit and generating a rectified signal according to the pair of differential coupled signals and the operation bias voltage, wherein during the first time interval, the rectifier circuit generates the rectified signal with a first DC bias voltage according to the pair of differential coupled signals, and during the second time interval, the rectifier circuit generates the rectified signal with a second DC bias voltage according to the operation bias voltage;
      a single to differential conversion circuit differentially amplifying the rectified signal and generating a pair of differential converted signals; and
      an offset compensation circuit adjusting a DC voltage of the pair of differential converted signals to generate the pair of differential output signals with DC matching.

13. The differential radio frequency signal receiver as claimed in claim 12, further comprising:
   a low noise amplifier module receiving and amplifying a pair of differential radio frequency signals, and generating a pair of differential amplified signals, accordingly;
   an oscillator generating a reference oscillation signal oscillated at a reference frequency; and
   a mixer receiving the pair of differential amplified signals and down converting the pair of differential amplified signals according to the reference oscillation signal to generate the pair of differential input signals.

14. The differential radio frequency signal receiver as claimed in claim 13, wherein the low noise amplifier module comprises two amplifying paths.

15. The differential radio frequency signal receiver as claimed in claim 14, wherein each amplifying path comprises a plurality of amplifier circuits coupled in serial.

16. The differential radio frequency signal receiver as claimed in claim 12, wherein the low noise amplifier module receives the pair of differential radio frequency signals via an input antenna.

17. The differential radio frequency signal receiver as claimed in claim 12, wherein the first DC bias voltage and the second DC bias voltage represent logic 1 and logic 0, or logic 0 and logic 1, respectively.

18. The differential radio frequency signal receiver as claimed in claim 12, wherein a carrier frequency of the differential radio frequency signal is 60 GHz.

19. A wireless radio frequency signal transceiving system, comprising:
   a differential radio frequency signal transmitter generating a pair of differential modulated signal according to an input signal and a pair of differential oscillation signals, amplifying the pair of differential modulated signals to generate a pair of differential radio frequency signals, and transmitting the pair of differential radio frequency signals, wherein the input signal is a digital signal, and when the input signal is at a first state, the modulator outputs the pair of differential oscillation signals as the pair of differential modulated signals, and when the input signal is at a second state, the modulator outputs a constant voltage signal as the pair of differential modulated signals; and
   a differential radio frequency signal receiver receiving the pair of differential radio frequency signals from a radio interface, and demodulating the pair of differential radio frequency signals to generate a pair of differential output signal.

20. The wireless radio frequency signal transceiving system as claimed in claim 19, wherein the differential radio frequency signal transmitter comprises:
   an oscillator generating the pair of differential oscillation signals;
   a modulator generating the pair of differential modulated signals according to the input signal and the pair of differential oscillation signals; and
   an amplifier module receiving and amplifying the pair of differential modulated signals, and generating the pair of differential radio frequency signals, accordingly.

21. The wireless radio frequency signal transceiving system as claimed in claim 20, wherein the modulator comprises:
   a transconductance circuit receiving the pair of differential oscillation signals; and
   a modulation circuit coupled to the transconductance circuit and generating the pair of differential modulated signals according to the input signal, wherein the modulation circuit comprises a first switch coupled between a pair of different output terminals of the modulator, and when the input signal is at the second state, the first switch is turned on.

22. The wireless radio frequency signal transceiving system as claimed in claim 19, wherein an oscillation frequency of the pair of differential oscillation signals equals a carrier frequency of the pair of differential radio frequency signals.

23. The wireless radio frequency signal transceiving system as claimed in claim 22, wherein the carrier frequency is 60 GHz.

\* \* \* \* \*